United States Patent
Hayami et al.

(10) Patent No.: US 11,195,697 B2
(45) Date of Patent: Dec. 7, 2021

(54) PLASMA CONTROL APPARATUS

(71) Applicant: SPP Technologies Co., Ltd., Tokyo (JP)

(72) Inventors: Toshihiro Hayami, Hyogo (JP); Ryosuke Fujii, Hyogo (JP)

(73) Assignee: SPP TECHNOLOGIES CO., LTD., Tokyo (JP)

( * ) Notice: Subject to any disclaimer, the term of this patent is extended or adjusted under 35 U.S.C. 154(b) by 133 days.

(21) Appl. No.: 15/760,298

(22) PCT Filed: Jan. 20, 2017

(86) PCT No.: PCT/JP2017/001942
§ 371 (c)(1),
(2) Date: Mar. 15, 2018

(87) PCT Pub. No.: WO2017/126662
PCT Pub. Date: Jul. 27, 2017

(65) Prior Publication Data
US 2018/0315581 A1    Nov. 1, 2018

(30) Foreign Application Priority Data

Jan. 22, 2016   (JP) .............................. JP2016-011012

(51) Int. Cl.
*H01J 37/32*      (2006.01)
*H01L 21/3065*    (2006.01)
(Continued)

(52) U.S. Cl.
CPC .. *H01J 37/32183* (2013.01); *H01J 37/32082* (2013.01); *H01J 37/3299* (2013.01);
(Continued)

(58) Field of Classification Search
CPC .......... H01J 37/32183; H01J 37/32082; H01J 37/3299; H01J 37/32155; H01J 37/32146;
(Continued)

(56) References Cited

U.S. PATENT DOCUMENTS 5,576,629 A  * 11/1996 Turner .................. B24B 37/013
                                                        118/708
6,252,354 B1 *  6/2001 Collins ................. H01J 37/321
                                                        315/111.51
(Continued)

FOREIGN PATENT DOCUMENTS

EP          0840350       5/1998
JP          4-237940      8/1992
(Continued)

*Primary Examiner* — Ram N Kackar
(74) *Attorney, Agent, or Firm* — Clark & Brody LP

(57) ABSTRACT

A plasma control apparatus includes a power source unit, a resonance producing unit, and a voltmeter. The resonance producing unit includes an LC circuit formed by a coil L1 and a capacitor C1 connected to each other, and a sensor S2 configured to detect a phase difference between current flowing in and voltage applied to the LC circuit, and the capacitor C1 of the LC circuit has a capacitance larger than an expected capacitance of the plasma P. The power source unit 1 configured to control the magnitude of radio-frequency power to be supplied in such a manner as to bring the voltage measured with the voltmeter 5 close to a set voltage as a target, and controls the frequency of the radio-frequency power to be supplied in such a manner as to minimize the phase difference detected with the sensor S2.

2 Claims, 12 Drawing Sheets

(51) Int. Cl.
*H05H 1/46* (2006.01)
*H01L 21/67* (2006.01)
*H03H 7/38* (2006.01)

(52) U.S. Cl.
CPC .. *H01J 37/32146* (2013.01); *H01J 37/32155* (2013.01); *H01J 37/32174* (2013.01); *H01L 21/3065* (2013.01); *H01L 21/67069* (2013.01); *H03H 7/38* (2013.01); *H05H 1/46* (2013.01); *H01J 37/321* (2013.01); *H01J 37/32091* (2013.01); *H01J 2237/24564* (2013.01); *H01J 2237/332* (2013.01); *H01J 2237/334* (2013.01)

(58) Field of Classification Search
CPC ........... H01J 37/32174; H01J 37/32091; H01J 37/321; H01J 2237/24564; H01J 2237/332; H01J 2237/334; H01L 21/3065; H01L 21/67069; H05H 1/46; H03H 7/38
USPC ..................................... 156/345.28
See application file for complete search history.

(56) References Cited

U.S. PATENT DOCUMENTS

| | | | |
|---|---|---|---|
| 6,305,316 B1 * | 10/2001 | DiVergilio | H01J 37/32082 |
| | | | 118/723 AN |
| 2001/0025691 A1 | 10/2001 | Kanno et al. | |
| 2005/0061442 A1 * | 3/2005 | Higashiura | H01J 37/32174 |
| | | | 156/345.44 |
| 2008/0241016 A1 | 10/2008 | Kato et al. | |
| 2014/0361690 A1 * | 12/2014 | Yamada | C23C 16/5096 |
| | | | 315/111.21 |

FOREIGN PATENT DOCUMENTS

| | | |
|---|---|---|
| JP | 2001-338917 | 12/2001 |
| JP | 2002-151429 | 5/2002 |
| JP | 2003-077893 | 3/2003 |
| JP | 2005-252057 | 9/2005 |
| JP | 4777481 | 9/2011 |
| JP | 2013-105664 | 5/2013 |
| JP | 2013-153432 | 8/2013 |
| WO | 2013/099133 | 7/2013 |

* cited by examiner

PLASMA CONTROL APPARATUS

TECHNICAL FIELD

The present invention relates to a plasma control apparatus that supplies radio-frequency power to a plasma processing apparatus for performing processing using plasma such as etching on a substrate. The present invention particularly relates to a plasma control apparatus that enables high-speed impedance matching between a power source unit and plasma even when the impedance of the plasma changes with a change in state of the plasma, and can perform processing using plasma with high accuracy and stability by achieving stable control over voltage and current, which is important in the processing using plasma.

BACKGROUND ART

A plasma processing apparatus that includes, as illustrated in FIG. 1, a chamber C, an element 10 attached to an upper portion of the chamber C and configured to generate plasma P in the chamber C, and a stage 20 attached to a lower portion of the chamber C and allowing a substrate S to be placed thereon, and that uses the plasma P generated in the chamber C to subject the placed substrate S to plasma processing such as etching has been known.

In a case where the plasma P is what is called inductively coupled plasma, a coil is used as the element 10, and in a case where the plasma P is what is called capacitively coupled plasma, an electrode disposed parallel to the stage 20 is used as the element 10.

To each of the stage 20 and the element 10, radio-frequency power is applied.

Specifically, a plasma control apparatus 100' is connected to the stage 20, and includes a power source unit 1' configured to supply the radio-frequency power, an impedance matching device 2' configured to perform impedance matching between the power source unit 1' and the plasma P. The radio-frequency power supplied from the power source unit 1' is applied to the stage 20 via the impedance matching device 2'.

A plasma control apparatus 200' is connected to the element 10, and includes a power source unit 3' configured to supply the radio-frequency power, and an impedance matching device 4' configured to perform impedance matching between the power source unit 3' and the plasma P. The radio-frequency power supplied from the power source unit 3' is applied to the element 10 via the impedance matching device 4'.

For example, in a case where the element 10 is the coil, and the inductively coupled plasma is generated in the chamber C, the radio-frequency power applied to coil 10 by the plasma control apparatus 200' generates a magnetic field, which excites gas with its pressure controlled in the chamber C, generating the plasma P. In addition, the radio-frequency power applied to the stage 20 by the plasma control apparatus 100' produces a potential difference between the plasma P and the stage 20, which causes ions in the plasma P to be vigorously attracted to the stage 20, promoting the plasma processing such as etching.

With reference to FIG. 2 to FIG. 4, a specific configuration example of the conventional plasma control apparatus 100' and 200' will be described below.

FIG. 2 is a diagram illustrating a specific configuration example of the plasma control apparatus 100'. Note that FIG. 2 does not illustrate the element 10 included in the plasma processing apparatus.

As illustrated in FIG. 2, the plasma control apparatus 100' includes the power source unit 1' and the impedance matching device 2'.

The power source unit 1' includes a power source control unit, a direct current (DC) power source, an oscillator of which frequency is fixed, a power amplifier, and a directional coupler S1. In FIG. 2, Tr1 and Tr2 each denote a transistor such as a FET and an IGBT. T1 denotes a transformer.

The impedance matching device 2' includes a matching device control unit, motors M, variable elements (variable capacitors VC1 and VC2 illustrated in FIG. 2, a variable coil not illustrated, and the like), and a sensor S2 configured to detect a ratio and a phase difference between the magnitude of current flowing in and the magnitude of voltage applied to the impedance matching device 2'.

In the plasma control apparatus 100' having the above configuration, the power source control unit of the power source unit 1' receives, as input, target set power, and a forward wave/reflected wave signal output from the directional coupler S1, and performs power feedback control in which output of the DC power source is adjusted in such a manner as to obtain the set power.

The matching device control unit of the impedance matching device 2' receives, as input, the ratio and the phase difference between the magnitude of the current flowing in and the magnitude of the voltage applied to the impedance matching device 2', the ratio and the phase difference being detected with the sensor S2, and monitors a matching state. In a case of an unmatched state, the matching device control unit performs impedance matching between the power source unit 1' and the plasma P by performing impedance feedback control in which constants of the variable elements (variable capacitors VC1 and VC2) are changed in a mechanically driven way from the motor M.

FIG. 3 and FIG. 4 are diagrams illustrating specific configuration examples of the plasma control apparatus 200'. FIG. 3 illustrates a case where the element 10 is a coil L1 (the plasma P is the inductively coupled plasma), and FIG. 4 illustrates a case where the element 10 is the electrode (the plasma P is the capacitively coupled plasma). As illustrated in FIG. 3 and FIG. 4, the plasma control apparatus 200' includes, as with the plasma control apparatus 100', a power source unit 3' and an impedance matching device 4'.

The power source unit 3' has the same configuration as the power source unit 1', and the impedance matching device 4' has the same configuration as the impedance matching device 2'.

Also in the plasma control apparatus 200' having the above configuration, as in the plasma control apparatus 100', a power source control unit of the power source unit 3' receives, as input, target set power, and a forward wave/reflected wave signal output from the directional coupler S1, and performs power feedback control in which output of the DC power source is adjusted in such a manner as to obtain the set power.

A matching device control unit of the impedance matching device 4' receives, as input, a ratio and a phase difference between the magnitude of current flowing in and the magnitude of voltage applied to the impedance matching device 4', the ratio and the phase difference being detected with the sensor S2, and monitors a matching state. In a case of an unmatched state, the matching device control unit performs impedance matching between the power source unit 3' and the plasma P by performing impedance feedback control in which constants of the variable elements (variable capacitors VC1 and VC2) are changed in a mechanically driven way from the motor M.

In the conventional plasma control apparatus 100' described above, the potential difference between the plasma P and the stage 20, and by extension, a potential difference between the stage 20 and a ground, that is, the voltage of the stage 20 (peak-to-peak voltage) monitored by a voltmeter (Vpp sensor) illustrated in FIG. 2 is indirectly determined by the set power set to the power source unit 1' (the set power input into the power source control unit of the power source unit 1') and a state of the plasma P. Therefore, when the state of the plasma P changes with a change in state of the substrate S being subjected to the plasma processing, and the impedance of the plasma P accordingly changes (e.g., when the capacitance of the capacitive component C2 changes in a plasma equivalent circuit illustrated in FIG. 2 that is made up of the capacitive component C2 and resistive components Rp1 and Rp2), the voltage of the stage 20 changes, which causes the potential difference between the plasma P and the stage 20 to change. This may result in a failure to perform the plasma processing such as etching with high accuracy and stability. In addition, the mechanically driven way to perform the impedance matching between the power source unit 1' and the plasma P involves a problem in that the matching cannot be performed at high speed.

In the conventional plasma control apparatus 200', the absorbed energy of the plasma P is indirectly determined by the set power set to the power source unit 3' (the set power input into the power source control unit of the power source unit 3') and the state of the plasma P. Therefore, when the state of the plasma P changes with a change in state of the substrate S being subjected to the plasma processing, and the impedance of the plasma P accordingly changes (e.g., when the inductance of an inductive component Lp or a mutual inductance Mp between the plasma P and the coil L1 changes in a plasma equivalent circuit illustrated in FIG. 3 that is made up of the inductive component Lp and a resistive component Rp, or when the capacitance of a capacitive component C2 changes in a plasma equivalent circuit illustrated in FIG. 4 that is made up of the capacitive component C2 and resistive components Rp1 and Rp2), the absorbed energy of the plasma P changes accordingly. This may result in a failure to perform the plasma processing such as etching with high accuracy and stability. In addition, the mechanically driven way to perform the impedance matching between the power source unit 3' and the plasma P involves a problem in that the matching cannot be performed at high speed.

In other words, in both of the conventional plasma control apparatus 100' and 200', there is a possibility that the impedance matching between the power source unit 1' or 3' and the plasma P cannot be performed at high speed, or a possibility that the plasma processing cannot be performed with high accuracy and stability when the impedance of the plasma P changes with a change in state of the plasma P.

For example, as the plasma control apparatus to be connected to the stage 20, there is proposed an apparatus such as one described in Patent Literature 1, but the apparatus is not one with which the above problem can be solved satisfactorily.

In addition, as the plasma control apparatus to be connected to the element 10 (coil), there is proposed an apparatus such as one described in Patent Literature 2, but the apparatus is not one with which the above problem can be solved satisfactorily.

To summarize the above, issues of the conventional plasma control apparatus include to implement high-speed impedance matching between a power source unit and plasma, as well as the followings.

(1) In a case where the generated plasma is inductively coupled plasma, propagation of power necessary for the generation and maintenance of the plasma is performed by inductive coupling with plasma by a plasma generating coil. For that reason, power absorbed into the plasma is in proportion to a square of current flowing through this coil. Consequently, control using a current value is more direct than control using a power value, and to maintain plasma generation more stably, stable current control is needed.

(2) Also in a case where the generated plasma is capacitively coupled plasma, propagation of power necessary for the generation and maintenance of the plasma is determined by the strength of a radio-frequency electric field given between a plasma generating electrode or a stage and the plasma. Furthermore, the strength of the electric field depends on radio-frequency voltage used for applying power. Consequently, control using a value of the voltage is more direct than control using a power value, and to maintain plasma generation more stably, stable voltage control is needed.

(3) In a plasma processing apparatus, by controlling energy for attracting ions generated by plasma to a substrate, an etched contour or a film state on the substrate is controlled. The energy of the attracted ions can be controlled using radio-frequency voltage applied to the stage or using DC bias of the stage that is generated by the radio-frequency voltage. Therefore, control using a voltage value is more direct than control using a power value, and to maintain etching performance or deposition performance more stably, stable voltage control is needed.

(4) Factors determining voltage applied to and current flowing through plasma depend on the impedance of the plasma. It is therefore difficult for conventional plasma control apparatus to operate these factors directly. This makes it difficult to perform plasma processing with high accuracy because controlling a processed contour or a film state on a substrate requires consideration of fluctuations attributable to changes in the impedance that fluctuates during the plasma processing, in addition to an assumption about these factors expected based on a plasma processing condition.

CITATION LIST

Patent Literature

[Patent Literature 1] JP4777481B
[Patent Literature 2] JP2005-252057A

SUMMARY OF INVENTION

Technical Problem

The present invention is made to solve the problems with the prior art described above and has an objective to provide a plasma control apparatus that enables high-speed impedance matching between a power source unit and plasma even when impedance of the plasma changes with a change in state of the plasma, and can perform plasma processing with high accuracy and stability by achieving stable control over voltage and current, which is important in the plasma processing.

Solution to Problem

To solve the above problems, the present invention provides, as a first aspect, a plasma control apparatus for supplying radio-frequency power to a plasma processing apparatus, the plasma processing apparatus including a coil for generating inductively coupled plasma or an electrode for generating capacitively coupled plasma, and a stage on which a substrate is placed, the placed substrate being subjected to processing using any one of the inductively coupled plasma and the capacitively coupled plasma, wherein the plasma control apparatus includes: a power source unit configured to supply radio-frequency power to the stage; a resonance producing unit interposed between the power source unit and the stage, and configured to apply the radio-frequency power supplied from the power source unit to the stage; and a voltmeter configured to measure a voltage of the stage, the resonance producing unit includes: an LC circuit formed by a coil and a capacitor connected to each other; and a sensor configured to detect a phase difference between current flowing in and voltage applied to the LC circuit, a capacitance of the capacitor of the LC circuit is larger than an expected capacitance of the plasma, and the power source unit is configured to control a magnitude of the radio-frequency power to be supplied in such a manner as to bring the voltage measured with the voltmeter close to a set voltage as a target, and is configured to control a frequency of the radio-frequency power to be supplied in such a manner as to minimize the phase difference detected with the sensor.

The plasma control apparatus according to the first aspect of the present invention is a plasma control apparatus that is connected to a stage on which a substrate is placed.

The resonance producing unit included in the plasma control apparatus according to the first aspect is connected to the stage and includes the LC circuit. In addition, the frequency of the radio-frequency power supplied from the power source unit is controlled (adjusted) in such a manner that the phase difference between the current flowing in and the voltage applied to the LC circuit is minimized (resonant state), the phase difference being detected with the sensor. Therefore, the LC circuit of the resonance producing unit, the stage, and the plasma are to form an RLC resonance circuit. As a result, voltage amplified through a resonance phenomenon is applied to the stage even when the impedance of the plasma changes. Moreover, the capacitance of the capacitor of the LC circuit is larger than the expected capacitance of the plasma. Therefore, even when the impedance of the plasma changes, the change has a small influence on a voltage change of the stage. Furthermore, the magnitude of the radio-frequency power supplied from the power source unit is controlled in such a manner as to bring the voltage of the stage measured with the voltmeter close to the set voltage as a target. With the above configuration, the voltage of the stage is kept at a value close to the set voltage even when the impedance of the plasma change with a change in state of the plasma, and processing using the plasma can therefore be performed with high accuracy and stability.

The formation of the RLC resonance circuit by the LC circuit of the resonance producing unit, the stage, and the plasma allows the impedance matching to be performed between the power source unit and the plasma, without the need of the mechanically driven way as in conventional practice and the impedance matching can be performed at high speed.

The expected capacitance of the plasma can be calculated through calculation with, for example, determination of constants of the variable elements at the time when the impedance matching device 2' completes the impedance matching between the power source unit 1' and the plasma P in the conventional plasma control apparatus 100' described above with reference to FIG. 2.

Specifically, the capacitance of the plasma is expected to be about 100 pF to 110 pF when the radio-frequency power supplied from the power source unit 1' has a frequency of 2 MHz, and expected to be about 400 pF to 1200 pF when the radio-frequency power supplied from the power source unit 1' has a frequency of 380 kHz.

As described above, the capacitance of the capacitor of the LC circuit is set to be larger than the expected capacitance of the plasma, and is preferably set to be about four times or more as large as the expected capacitance of the plasma.

Plasma processing apparatus to which the plasma control apparatus according to the first aspect of the present invention is applied include apparatus for performing etching or deposition on a substrate using generated plasma as it is, as well as apparatus for performing etching or deposition on a substrate using neutral particles obtained by neutralizing ions in generated plasma. This also applies to plasma processing apparatus according to a second aspect and a third aspect to be described later.

To solve the above problems, the present invention provides, as a second aspect, a plasma control apparatus for supplying radio-frequency power to a plasma processing apparatus, the plasma processing apparatus including a plasma generating coil for generating inductively coupled plasma, and a stage on which a substrate is placed, the placed substrate being subjected to plasma processing using the inductively coupled plasma, wherein the plasma control apparatus includes: a power source unit configured to supply radio-frequency power to the plasma generating coil; a resonance producing unit interposed between the power source unit and the plasma generating coil, and configured to apply the radio-frequency power supplied from the power source unit to the plasma generating coil; and an ammeter configured to measure a current flowing through the plasma generating coil, the resonance producing unit includes: a capacitor connected in parallel or in series to the plasma generating coil; and a sensor configured to detect a phase difference between current flowing in and voltage applied to the resonance producing unit, and the power source unit is configured to control a magnitude of the radio-frequency power to be supplied in such a manner as to bring the current measured with the ammeter close to a set current as a target, and is configured to control a frequency of the radio-frequency power to be supplied in such a manner as to minimize the phase difference detected with the sensor.

The plasma control apparatus according to the second aspect of the present invention is a plasma control apparatus that is connected to a plasma generating coil for generating inductively coupled plasma.

The resonance producing unit included in the plasma control apparatus according to the second aspect is connected to the plasma generating coil and includes a capacitor connected in parallel or in series to the plasma generating coil. In addition, the frequency of the radio-frequency power supplied from the power source unit is controlled (adjusted) in such a manner that the phase difference between the current flowing in and the voltage applied to the resonance producing unit is minimized (resonant state), the phase difference being detected with the sensor. Therefore, the capacitor of the resonance producing unit, the plasma generating coil, and the plasma are to form an RLC resonance circuit. As a result, current amplified through a resonance phenomenon flows through the plasma generating coil even when the impedance of the plasma changes. The magnitude of the radio-frequency power supplied from the power source unit is controlled in such a manner as to bring the current flowing through the plasma generating coil measured with the ammeter close to set current as a target. With the above configuration, the value of the current flowing through the plasma generating coil is kept at a value close to the set current even when the impedance of the plasma changes with a change in state of the plasma. It is known that the absorbed energy of plasma is in proportion to a square of current flowing through a plasma generating coil. Therefore, keeping the current flowing through the plasma generating coil at the value close to the set current makes changes in the absorbed energy of the plasma small, enabling plasma processing to be performed with high accuracy and stability.

The formation of the RLC resonance circuit by the capacitor of the resonance producing unit, the plasma generating coil, and the plasma allows the impedance matching to be performed between the power source unit and the plasma, without the need of the mechanically driven way as in conventional practice and the impedance matching can be performed at high speed.

To solve the above problems, the present invention provides, as a third aspect, a plasma control apparatus for supplying radio-frequency power to a plasma processing apparatus, the plasma processing apparatus including a plasma generating electrode for generating capacitively coupled plasma, and a stage on which a substrate is placed, the placed substrate being subjected to processing using the capacitively coupled plasma, wherein the plasma control apparatus includes: a power source unit configured to supply radio-frequency power to the plasma generating electrode; a resonance producing unit interposed between the power source unit and the plasma generating electrode, and configured to apply the radio-frequency power supplied from the power source unit to the plasma generating electrode; and a voltmeter configured to measure a voltage of the plasma generating electrode, the resonance producing unit includes: an LC circuit formed by a coil and a capacitor connected to each other; and a sensor configured to detect a phase difference between current flowing in and voltage applied to the LC circuit, a capacitance of the capacitor of the LC circuit is larger than an expected capacitance of the plasma, and the power source unit is configured to control a magnitude of the radio-frequency power to be supplied in such a manner as to bring the voltage measured with the voltmeter close to a set voltage as a target, and is configured to control a frequency of the radio-frequency power to be supplied in such a manner as to minimize the phase difference detected with the sensor.

The plasma control apparatus according to the third aspect of the present invention is a plasma control apparatus that is connected to a plasma generating electrode for generating capacitively coupled plasma.

The resonance producing unit included in the plasma control apparatus according to the third aspect is connected to the plasma generating electrode and includes the LC circuit. In addition, the frequency of the radio-frequency power supplied from the power source unit is controlled (adjusted) in such a manner that the phase difference between the current flowing in and the voltage applied to the LC circuit is minimized (resonant state), the phase difference being detected with the sensor. Therefore, the LC circuit of the resonance producing unit, the plasma generating electrode, and the plasma are to form an RLC resonance circuit. As a result, voltage amplified through a resonance phenomenon is applied to the plasma generating electrode even when the impedance of the plasma changes. Moreover, the capacitance of the capacitor of the LC circuit is larger than the expected capacitance of the plasma. Therefore, even when the impedance of the plasma changes, the change has a small influence on a voltage change of the plasma generating electrode. Furthermore, the magnitude of the radio-frequency power supplied from the power source unit is controlled in such a manner as to bring the voltage of the plasma generating electrode measured with the voltmeter close to the set voltage as a target. With the above configuration, the voltage of the plasma generating electrode is kept at a value close to the set voltage even when the impedance of the plasma change with a change in state of the plasma, making changes in the absorbed energy of the plasma small, and processing using the plasma can therefore be performed with high accuracy and stability.

The formation of the RLC resonance circuit by the LC circuit of the resonance producing unit, the plasma generating electrode, and the plasma allows the impedance matching to be performed between the power source unit and the plasma, without the need of the mechanically driven way as in conventional practice and the impedance matching can be performed at high speed.

The expected capacitance of the plasma can be calculated through calculation with, for example, determination of constants of the variable elements at the time when the impedance matching device 4' completes the impedance matching between the power source unit 3' and the plasma P in the conventional plasma control apparatus 200' described above with reference to FIG. 4.

Specifically, the capacitance of the plasma is expected to be about 100 pF to 110 pF when the radio-frequency power supplied from the power source unit 3' has a frequency of 2 MHz, and expected to be about 400 pF to 1200 pF when the radio-frequency power supplied from the power source unit 3' has a frequency of 380 kHz.

As described above, the capacitance of the capacitor of the LC circuit is set to be larger than the expected capacitance of the plasma, and is preferably set to be about four times or more as large as the expected capacitance of the plasma.

Each of the plasma control apparatus according to the first aspect to the third aspect of the present invention can be applied to plasma processing apparatus alone. In a case of a plasma processing apparatus in which inductively coupled plasma is generated, the plasma control apparatus according to the first aspect and the second aspect are applicable in combination. In a case of a plasma processing apparatus in which capacitively coupled plasma is generated, the plasma control apparatus according to the first aspect and the third aspect are applicable in combination.

Advantageous Effects of Invention

The plasma control apparatus according to the present invention enable high-speed impedance matching between a power source unit and plasma even when the impedance of the plasma changes with a change in state of the plasma, and can perform processing using plasma with high accuracy and stability by achieving stable control over voltage and current, which is important in the processing using plasma.

DESCRIPTION OF EMBODIMENTS

Hereafter, embodiments of the present invention will be described with reference to the accompanying drawings.

First Embodiment

Figure 5:
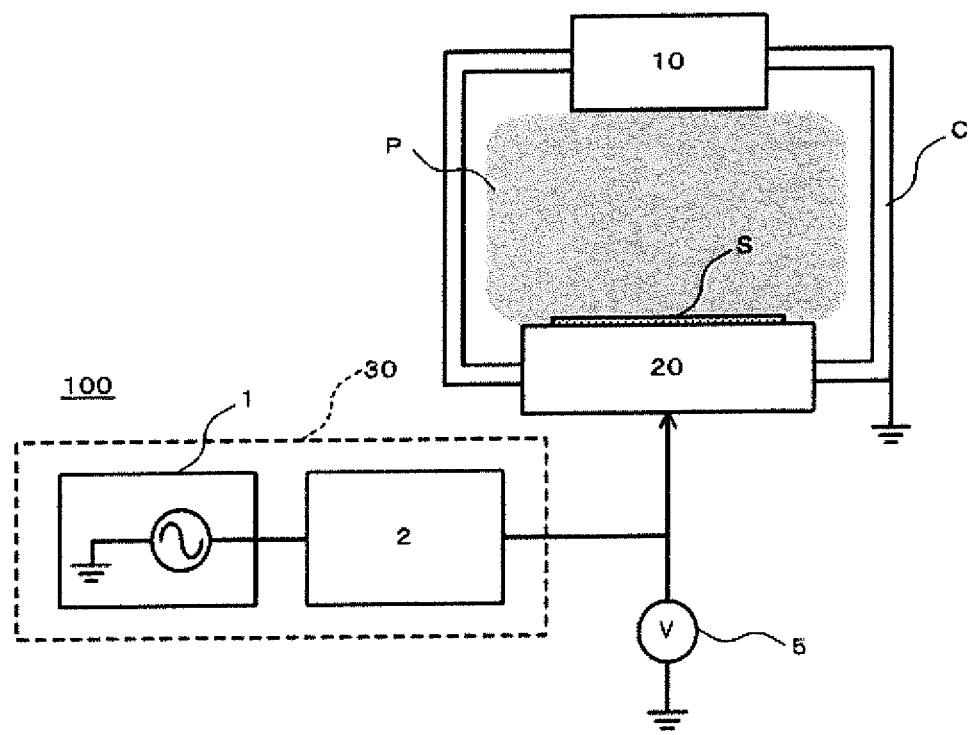
FIG. 5 is a schematic configuration diagram of a plasma control apparatus according to a first embodiment of the present invention.

FIG. 5 is a schematic configuration diagram of a plasma control apparatus according to a first embodiment of the present invention.

As illustrated in FIG. 5, a plasma processing apparatus to which a plasma control apparatus 100 according to the first embodiment is applied has the following configuration. In other words, the plasma processing apparatus is an apparatus that includes a chamber C, an element 10 attached to an upper portion of the chamber C and configured to generate plasma P in the chamber C, and a stage 20 attached to a lower portion of the chamber C and allowing a substrate S to be placed thereon, and that uses the plasma P generated in the chamber C to subject the placed substrate S to processing using plasma such as etching. In a case where the plasma P is what is called inductively coupled plasma, a coil is used as the element 10, and in a case where the plasma P is what is called capacitively coupled plasma, an electrode disposed parallel to the stage 20 is used as the element 10.

The plasma control apparatus 100 according to the first embodiment is an apparatus that supplies radio-frequency power to the stage 20 of the plasma processing apparatus having the above configuration. As illustrated in FIG. 5, the plasma control apparatus 100 includes a power source unit 1 configured to supply the radio-frequency power to the stage 20, a resonance producing unit 2 interposed between the power source unit 1 and the stage 20 and configured to apply the radio-frequency power supplied from the power source unit 1 to the stage 20, and a voltmeter 5 configured to measure the voltage of the stage 20. In the present embodiment, the power source unit 1 and the resonance producing unit 2 are integrated into a power source apparatus 30.

Figure 6:
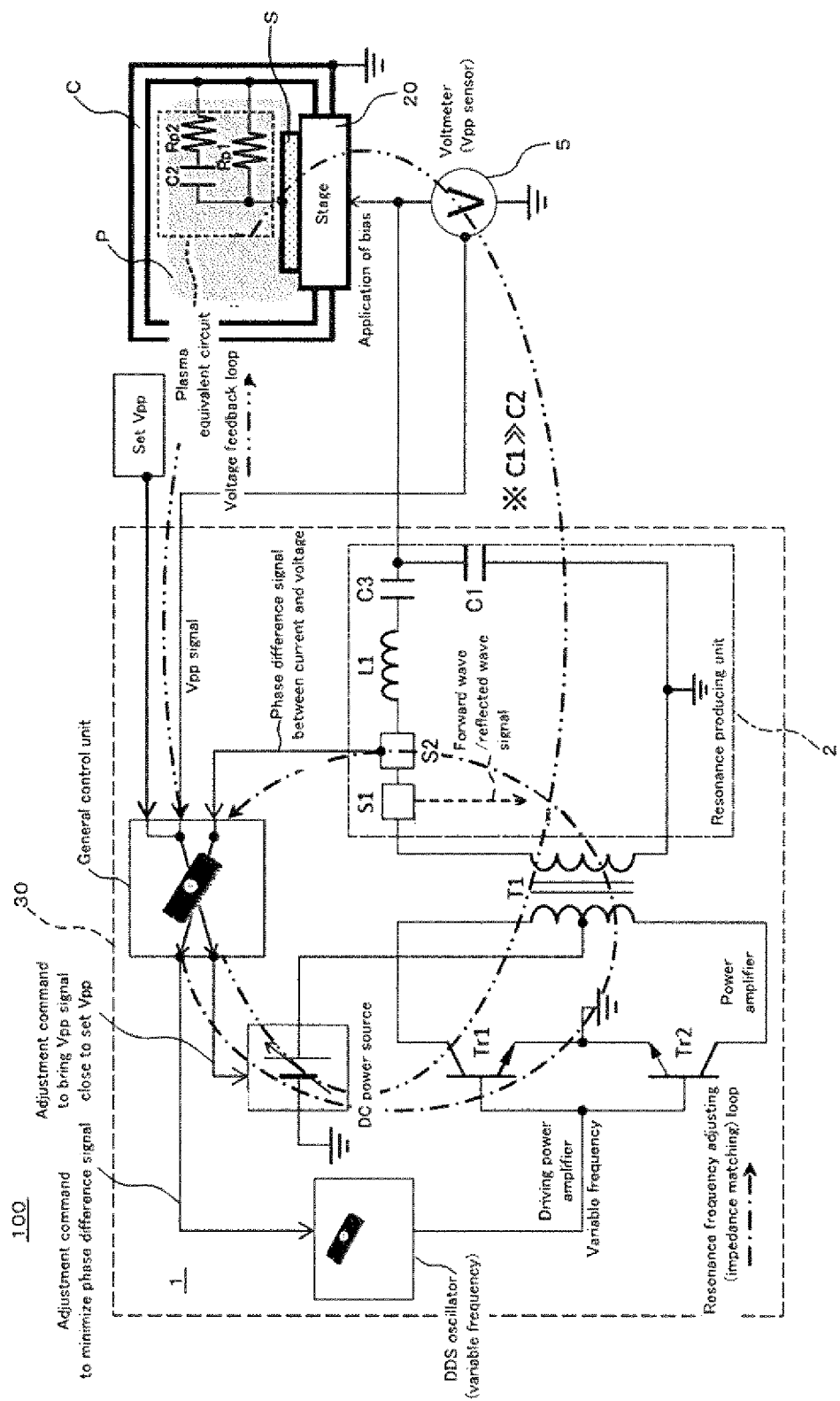
FIG. 6 is a diagram illustrating a specific configuration example of the plasma control apparatus according to the first embodiment of the present invention.

With reference to FIG. 6, a specific configuration example of the plasma control apparatus 100 according to the first embodiment will be described below.

FIG. 6 is a diagram illustrating a specific configuration example of the plasma control apparatus 100 according to the first embodiment. Note that FIG. 6 does not illustrate the element 10 included in the plasma processing apparatus.

As illustrated in FIG. 6, the plasma control apparatus 100 includes the power source unit 1, the resonance producing unit 2, and the voltmeter (a Vpp sensor configured to measure peak-to-peak voltage Vpp) 5, and the power source unit 1 and the resonance producing unit 2 are integrated into the power source apparatus 30.

The power source unit 1 is made up of elements making up the power source apparatus 30 except elements making up the resonance producing unit 2 and includes a general control unit, a DC power source, an oscillator of which frequency is variable (e.g., direct digital synthesizer (DDS)), and a power amplifier. In FIG. 6, Tr1 and Tr2 each denote a transistor such as a FET and an IGBT. T1 denotes a transformer.

The resonance producing unit 2 includes an LC circuit including a coil L1 and a capacitor C1 (further including a capacitor C3 in the present embodiment) connected to each other (specifically, a series LC circuit formed by the coil L1 and the capacitor C1 connected in series), and a sensor S2 configured to detect a phase difference between current flowing in and voltage applied to the LC circuit. The capacitors C1 and C3 are fixed capacitors each having a fixed capacitance, and titanium oxide capacitors are used as such. The sensor S2 is attached to the LC circuit, includes a transformer for extracting the current and a capacitor for extracting the voltage, and has a circuit configuration in which a potential difference is produced in accordance with the phase difference between the extracted current and voltage. The capacitor C1 of the LC circuit included in the resonance producing unit 2 has a capacitance that is set to be larger than the expected capacitance of the plasma P. In other words, the capacitance of the capacitor C1 is set to be larger than the expected capacitance of a capacitive component C2 in a plasma equivalent circuit illustrated in FIG. 6 that is made up of the capacitive component C2 and resistive components Rp1 and Rp2.

The resonance producing unit 2 includes a directional coupler S1, and a forward wave/reflected wave signal output from the directional coupler S1 is not used for the control by the general control unit of the power source unit 1 but merely monitorable.

The power source unit 1 is configured to control the magnitude of the radio-frequency power to be supplied in such a manner as to bring the voltage measured with the voltmeter 5 close to a set voltage as a target. Specifically, the general control unit of the power source unit 1 receives, as input, the set voltage as a target (set Vpp) and the voltage measured with the voltmeter 5 (Vpp signal), and the general control unit performs voltage feedback control for adjusting output of the DC power source in such a manner as to bring the measured voltage close to the set voltage.

In addition, the power source unit 1 is configured to control the frequency of the radio-frequency power to be supplied in such a manner as to minimize the phase difference detected with the sensor S2. Specifically, the general control unit of the power source unit 1 is configured to receive, as input, the phase difference detected with the sensor S2 of the resonance producing unit 2, and performs resonance frequency adjusting control (impedance feedback control) in which the frequency of the oscillator is controlled in such a manner as to minimize this phase difference.

In the plasma control apparatus 100 according to the first embodiment described above, the resonance producing unit 2 is connected to the stage 20 and includes the LC circuit. Since the frequency of the radio-frequency power supplied from the power source unit 1 is controlled (adjusted) in such a manner that the phase difference between the current flowing in and the voltage applied to the LC circuit is minimized (resonant state), the phase difference being detected with the sensor S2, the LC circuit of the resonance producing unit 2, the stage 20, and the plasma P form an RLC resonance circuit (specifically, a series RLC resonance circuit). As a result, voltage amplified through a resonance phenomenon is applied to the stage 20 even when the impedance of the plasma P changes.

The RLC resonance circuit illustrated in FIG. 6 is formed by the coil L1, capacitor C1, capacitor C3, capacitive component C2, and resistive component Rp2. Assuming that Z denotes the impedance of this RLC resonance circuit, L1 denotes the inductance of the coil L1, C1 denotes the capacitance of the capacitor C1, C3 denotes the capacitance of the capacitor C3, C2 denotes the expected capacitance of the capacitive component C2, Rp2 denotes the resistance value of the resistive component Rp2, and $\omega$ denotes the frequency of the radio-frequency power in terms of angular frequency, $Z=Rp2+j[\omega*L1-C3*(C1+C2)/\{\omega*(C1+C2+C3)\}]$ is established.

In the resonant state, the imaginary component of the impedance Z becomes close to zero, and the impedance of the RLC resonance circuit becomes equal to Rp2.

Moreover, the capacitance C1 of the capacitor C1 of the LC circuit is larger than the expected capacitance of the plasma P (the expected capacitance C2 of the capacitive component C2). Therefore, even when the impedance of the plasma P changes, the impedance Z of the RLC resonance circuit does not change greatly, and thus the change in the impedance of the plasma has a small influence on a voltage change of the stage 20.

Furthermore, the magnitude of the radio-frequency power supplied from the power source unit 1 is controlled in such a manner as to bring the voltage of the stage 20 measured with the voltmeter 5 close to the set voltage as a target. With the above configuration, the voltage of the stage 20 is kept at a value close to the set voltage even when the impedance of the plasma P changes with a change in state of the plasma P, and processing using the plasma can therefore be performed with high accuracy and stability.

The formation of the RLC resonance circuit by the LC circuit of the resonance producing unit 2, the stage 20, and the plasma P allows the impedance matching to be performed between the power source unit 1 and the plasma P, without the need of the mechanically driven way as in conventional practice and the impedance matching can be performed at high speed. In addition, use of a direct digital synthesizer (DDS) as an oscillator of which frequency is variable dispenses with the mechanically driven way, and frequency of the oscillator can be controlled at high speed.

Furthermore, the power source unit 1 and the resonance producing unit 2 are integrated into the power source apparatus 30. Therefore, when this power source apparatus 30 is connected directly to the stage 20 without commercial coaxial cable or the like, a characteristic impedance need not be limited to a characteristic impedance determined by standard (e.g., 50Ω) but can be freely set, and high voltage can be generated with low output.

Second Embodiment

Figure 7:
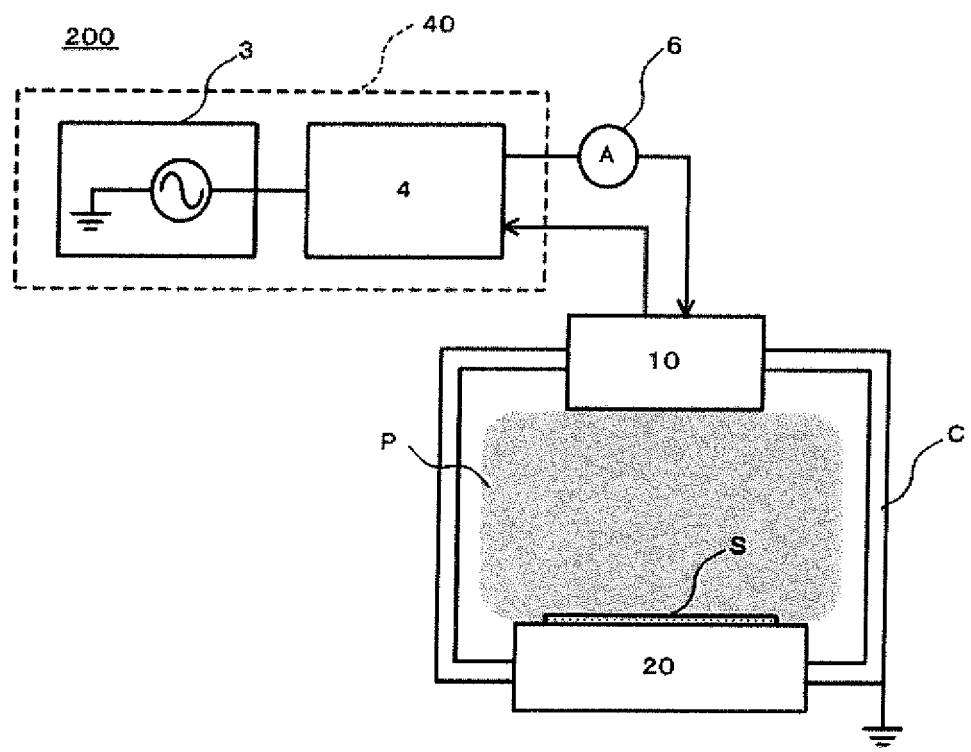
FIG. 7 is a schematic configuration diagram of a plasma control apparatus according to a second embodiment of the present invention.

FIG. 7 is a schematic configuration diagram of a plasma control apparatus according to a second embodiment of the present invention.

As illustrated in FIG. 7, a plasma processing apparatus to which a plasma control apparatus 200 according to the second embodiment is applied has the same configuration as that of the plasma processing apparatus described in the first embodiment. However, in the plasma processing apparatus to which the plasma control apparatus 200 according to the second embodiment is applied, the plasma P is inductively coupled plasma, and a coil is used as the element 10.

The plasma control apparatus 200 according to the second embodiment is an apparatus that supplies radio-frequency power to an element (a plasma generating coil) 10 of a plasma processing apparatus having the above configuration. As illustrated in FIG. 7, the plasma control apparatus 200 includes a power source unit 3 configured to supply the radio-frequency power to the element 10, a resonance producing unit 4 interposed between the power source unit 3 and the element 10, and configured to apply the radio-frequency power supplied from the power source unit 3 to the element 10, and an ammeter 6 configured to measure current flowing through the element 10. In the present embodiment, the power source unit 3 and the resonance producing unit 4 are integrated into a power source apparatus 40.

Figure 8:
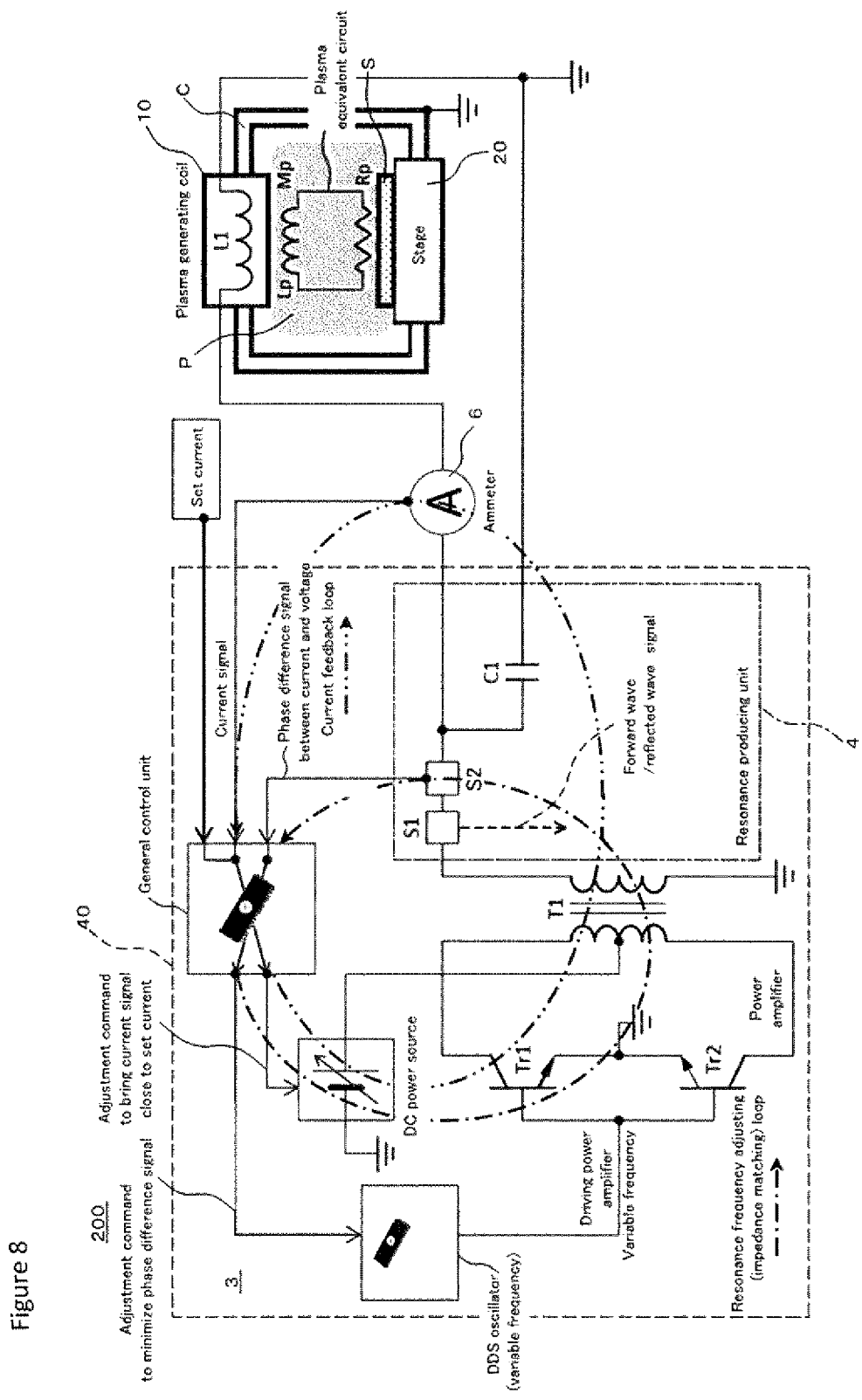
FIG. 8 is a diagram illustrating a specific configuration example of the plasma control apparatus according to the second embodiment of the present invention.

With reference to FIG. 8, a specific configuration example of the plasma control apparatus 200 according to the second embodiment will be described below.

FIG. 8 is a diagram illustrating a specific configuration example of the plasma control apparatus 200 according to the second embodiment.

As illustrated in FIG. 8, the plasma control apparatus 200 includes the power source unit 3, the resonance producing unit 4, and the ammeter 6, and the power source unit 3 and the resonance producing unit 4 are integrated into the power source apparatus 40.

The power source unit 3 is made up of elements making up the power source apparatus 40 except elements making up the resonance producing unit 4 and includes a general control unit, a DC power source, an oscillator of which frequency is variable (e.g., direct digital synthesizer (DDS)), and a power amplifier. In FIG. 8, Tr1 and Tr2 each denote a transistor such as an FET and an IGBT. T1 denotes a transformer.

The resonance producing unit 4 includes a capacitor C1 that is connected in parallel to a plasma generating coil L1 as the element 10, and a sensor S2 configured to detect a phase difference between current flowing in and voltage applied to the resonance producing unit 4. The capacitor C1 is a fixed capacitor having a fixed capacitance, and a titanium oxide capacitor is used as such.

The resonance producing unit 4 includes a directional coupler S1, and a forward wave/reflected wave signal output from the directional coupler S1 is not used for the control by the general control unit of the power source unit 3 but merely monitorable.

The power source unit 3 is configured to control the magnitude of the radio-frequency power to be supplied in such a manner as to bring the current measured with the ammeter 6 close to set current as a target. Specifically, the general control unit of the power source unit 3 is configured to receive, as input, the set current as a target and the current measured with the ammeter 6, and the general control unit performs current feedback control for adjusting output of the DC power source in such a manner as to bring the measured current close to the set current.

In addition, the power source unit 3 is configured to control the frequency of the radio-frequency power to be supplied in such a manner as to minimize the phase difference detected with the sensor S2. Specifically, the general control unit of the power source unit 3 is configured to receive, as input, the phase difference detected with the sensor S2 of the resonance producing unit 4, and performs resonance frequency adjusting control (impedance feedback control) in which the frequency of the oscillator is controlled in such a manner as to minimize this phase difference.

In the plasma control apparatus 200 according to the second embodiment described above, the resonance producing unit 4 is connected to the plasma generating coil L1 and includes the capacitor C1 that is connected in parallel to the plasma generating coil L1. In addition, the frequency of the radio-frequency power supplied from the power source unit 3 is controlled (adjusted) in such a manner that the phase difference between the current flowing in and the voltage applied to the resonance producing unit 4 is minimized (resonant state), the phase difference being detected with the sensor S2. Therefore, the capacitor C1 of the resonance producing unit 4, the plasma generating coil L1, and the plasma P are to form an RLC resonance circuit. With this configuration, current amplified through a resonance phenomenon flows through the plasma generating coil L1 even when the impedance of the plasma P changes. The magnitude of the radio-frequency power supplied from the power source unit 3 is controlled in such a manner as to bring the current flowing through the plasma generating coil L1 measured with the ammeter 6 close to set current as a target. With the above configuration, the current flowing through the plasma generating coil L1 is kept at a value close to the set current even when the impedance of the plasma P changes with a change in state of the plasma P, making changes in the absorbed energy of the plasma P small, and processing using the plasma can therefore be performed with high accuracy and stability.

The formation of the RLC resonance circuit by the capacitor C1 of the resonance producing unit 4, the plasma generating coil L1, and the plasma P allows the impedance matching to be performed between the power source unit 3 and the plasma P, without the need of the mechanically driven way as in conventional practice and the impedance matching can be performed at high speed. In addition, use of a direct digital synthesizer (DDS) as an oscillator of which frequency is variable dispenses with the mechanically driven way, and frequency of the oscillator can be controlled at high speed.

Furthermore, the power source unit 3 and the resonance producing unit 4 are integrated into the power source apparatus 40. Therefore, when this power source apparatus 40 is connected directly to the plasma generating coil L1 without commercial coaxial cable or the like, a characteristic impedance need not be limited to a characteristic impedance determined by standard (e.g., 50Ω) but can be freely set, and high current can be generated with low output.

Figure 9:
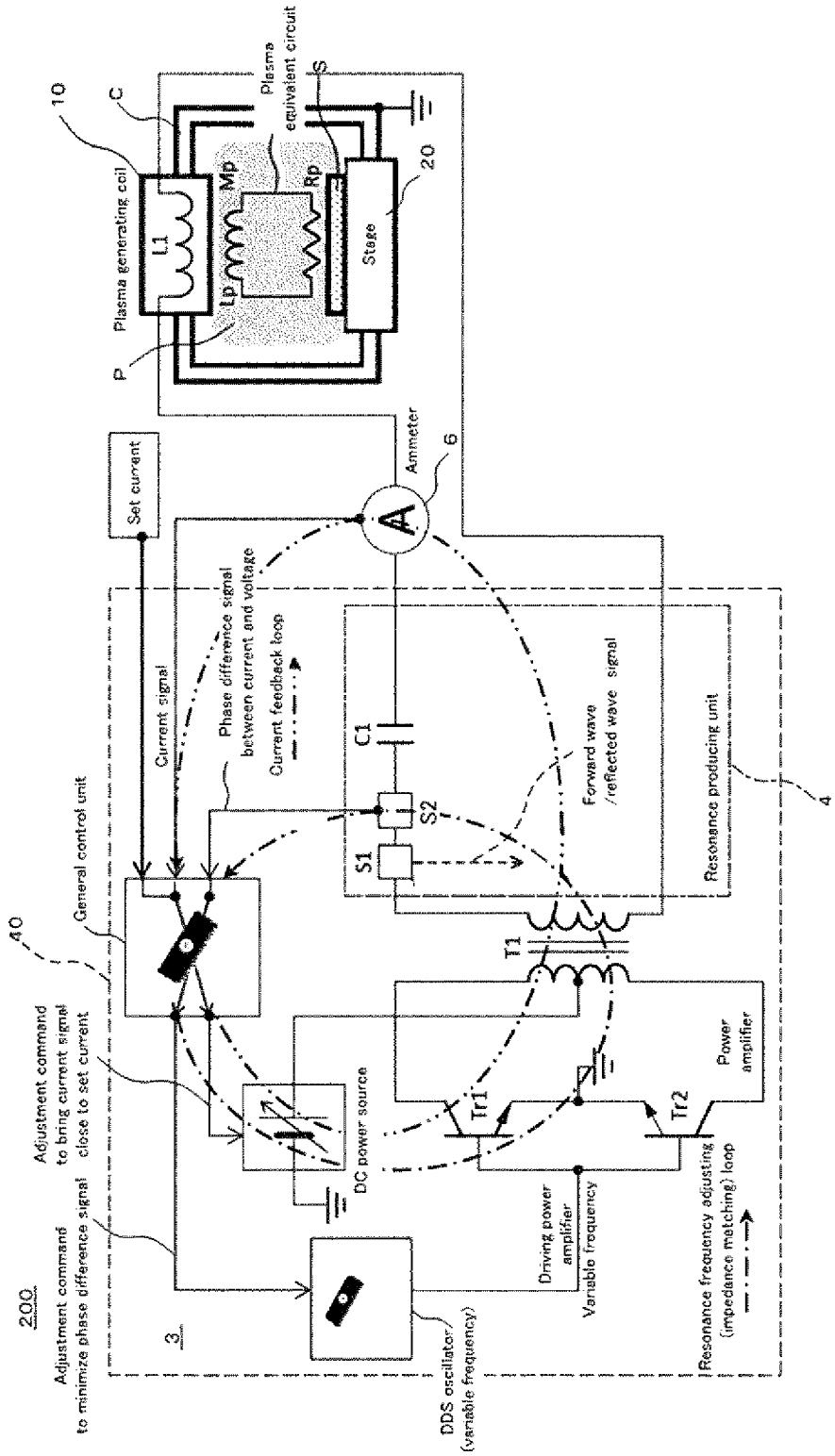
FIG. 9 is a diagram illustrating another specific configuration example of the plasma control apparatus according to the second embodiment of the present invention.

Description is made with reference to FIG. 8 about the example in which the capacitor C1 included in the resonance producing unit 4 is connected in parallel to the plasma generating coil L1, but the present invention is not limited to the example, and the capacitor C1 included in the resonance producing unit 4 may be connected in series to the plasma generating coil L1 as illustrated in FIG. 9.

Third Embodiment

Figure 10:
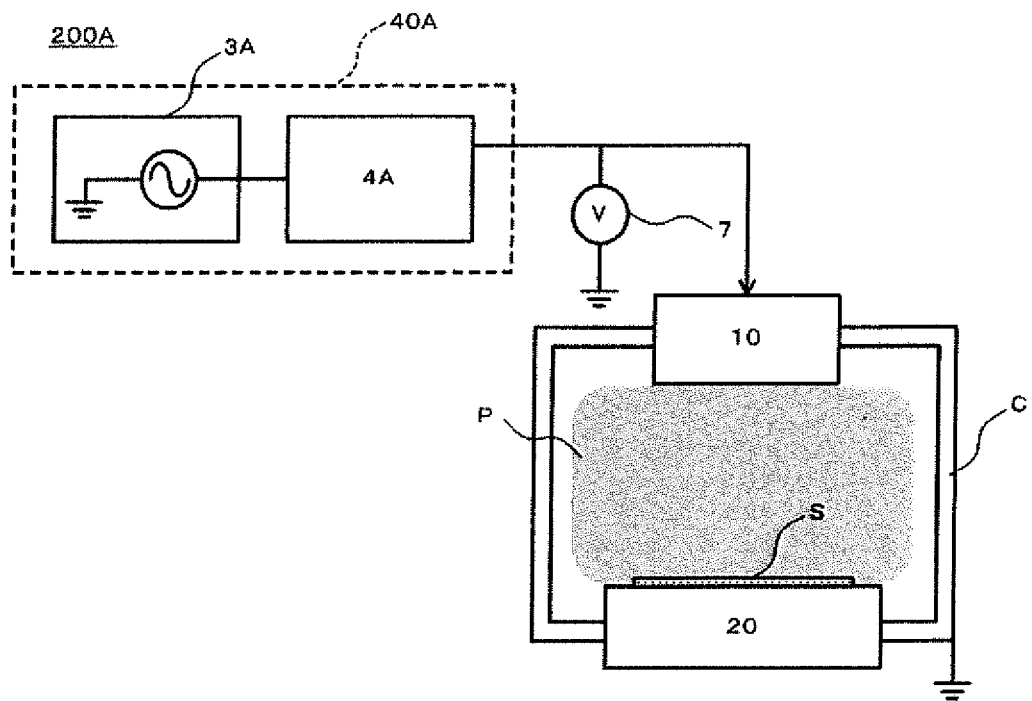
FIG. 10 is a schematic configuration diagram of a plasma control apparatus according to a third embodiment of the present invention.

FIG. 10 is a schematic configuration diagram of a plasma control apparatus according to a third embodiment of the present invention.

As illustrated in FIG. 10, a plasma processing apparatus to which a plasma control apparatus 200A according to the third embodiment is applied has the same configuration as those of the plasma processing apparatus described in the first and second embodiments. However, in the plasma processing apparatus to which the plasma control apparatus 200A according to the third embodiment is applied, the plasma P is capacitively coupled plasma, and an electrode is used as the element 10.

The plasma control apparatus 200A according to the third embodiment is an apparatus that supplies radio-frequency power to an element (a plasma generating electrode) 10 of a plasma processing apparatus having the above configuration. As illustrated in FIG. 10, the plasma control apparatus 200A includes a power source unit 3A configured to supply the radio-frequency power to the element 10, a resonance producing unit 4A interposed between the power source unit 3A and the element 10 and configured to apply the radio-frequency power supplied from the power source unit 3A to the element 10, and a voltmeter 7 configured to measure voltage of the element 10. In the present embodiment, the power source unit 3A and the resonance producing unit 4A are integrated into a power source apparatus 40A.

Figure 11:
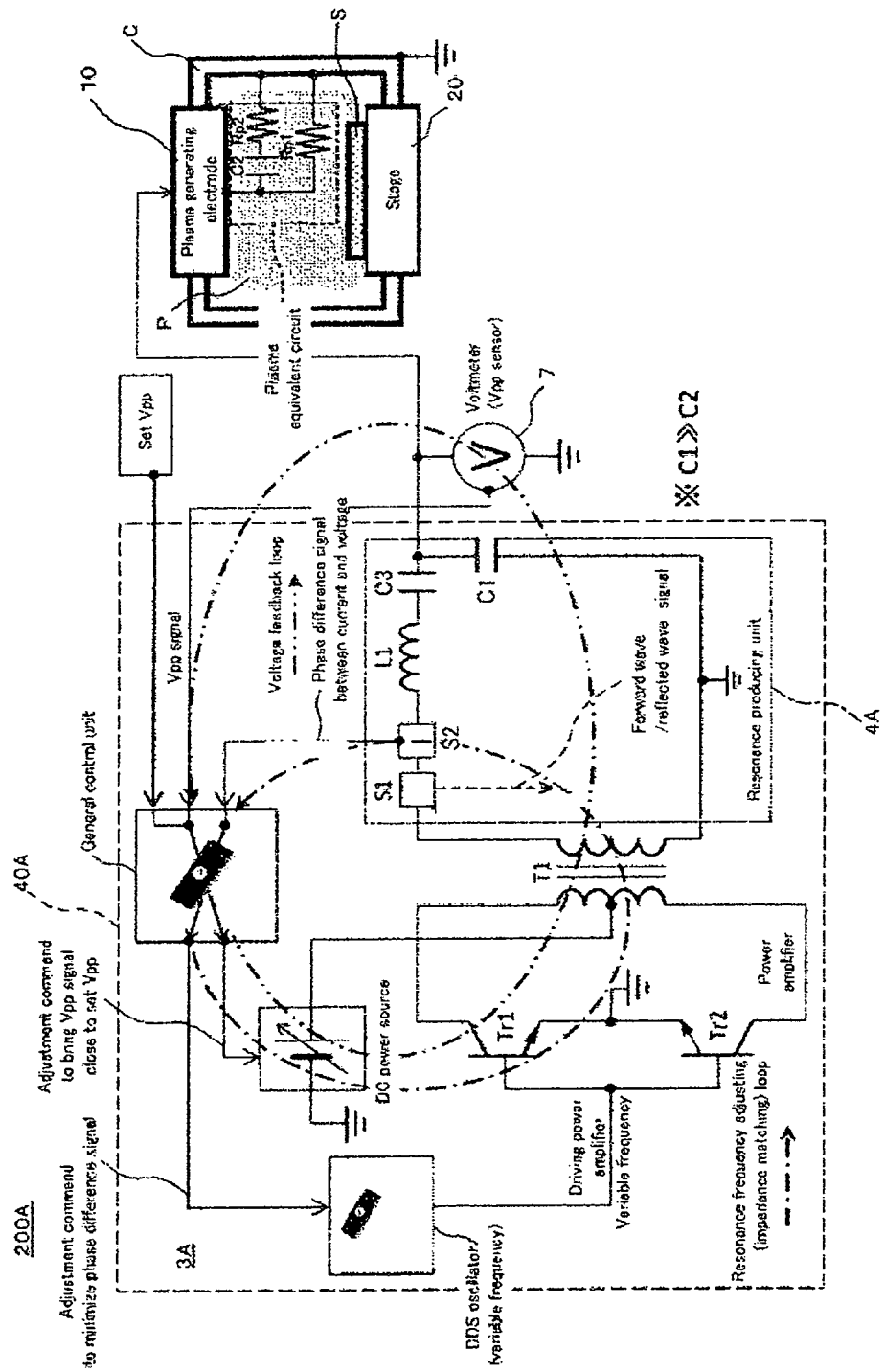
FIG. 11 is a diagram illustrating a specific configuration example of the plasma control apparatus according to the third embodiment of the present invention.

With reference to FIG. 11, a specific configuration example of the plasma control apparatus 200A according to the third embodiment will be described below.

FIG. 11 is a diagram illustrating a specific configuration example of the plasma control apparatus 200A according to the third embodiment.

As illustrated in FIG. 11, the plasma control apparatus 200A includes the power source unit 3A, the resonance producing unit 4A, and the voltmeter (a Vpp sensor configured to measure peak-to-peak voltage Vpp) 7, and the power source unit 3A and the resonance producing unit 4A are integrated into the power source apparatus 40A.

The power source unit 3A is made up of elements making up the power source apparatus 40A except elements making up the resonance producing unit 4A and includes a general control unit, a DC power source, an oscillator of which frequency is variable (e.g., direct digital synthesizer (DDS)), and a power amplifier. In FIG. 11, Tr1 and Tr2 each denote a transistor such as an FET and an IGBT. T1 denotes a transformer.

The resonance producing unit 4A includes an LC circuit including a coil L1 and a capacitor C1 (further including a capacitor C3 in the present embodiment) connected to each other (specifically, a series LC circuit formed by the coil L1 and the capacitor C1 connected in series), and a sensor S2 configured to detect a phase difference between current flowing in and voltage applied to the LC circuit. The capacitors C1 and C3 are fixed capacitors each having a fixed capacitance, and titanium oxide capacitors are used as such. The capacitor C1 of the LC circuit included in the resonance producing unit 4A has a capacitance that is set to be larger than an expected capacitance of the plasma P. In other words, the capacitance of the capacitor C1 is set to be larger than the expected capacitance of a capacitive component C2 in a plasma equivalent circuit illustrated in FIG. 11 that is made up of the capacitive component C2 and resistive components Rp1 and Rp2.

The resonance producing unit 4A includes a directional coupler S1, and a forward wave/reflected wave signal output from the directional coupler S1 is not used for the control by the general control unit of the power source unit 3A but merely monitorable.

The power source unit 3A is configured to control the magnitude of the radio-frequency power to be supplied in such a manner as to bring the voltage measured with the voltmeter 7 close to a set voltage as a target. Specifically, the general control unit of the power source unit 3A is configured to receive, as input, the set voltage as a target (set Vpp) and the voltage measured with the voltmeter 7 (Vpp signal), and the general control unit performs voltage feedback control for adjusting output of the DC power source in such a manner as to bring the measured voltage close to the set voltage.

In addition, the power source unit 3A controls the frequency of the radio-frequency power to be supplied in such a manner as to minimize the phase difference detected with the sensor S2. Specifically, the general control unit of the power source unit 3A receives, as input, the phase difference detected with the sensor S2 of the resonance producing unit 4A, and performs resonance frequency adjusting control (impedance feedback control) in which the frequency of the oscillator is controlled in such a manner as to minimize this phase difference.

In the plasma control apparatus 200A according to the third embodiment described above, the resonance producing unit 4A is connected to the plasma generating electrode 10 and includes the LC circuit. The frequency of the radio-frequency power supplied from the power source unit 3A is controlled (adjusted) in such a manner that the phase difference between the current flowing in and the voltage applied to the LC circuit is minimized (resonant state), the phase difference being detected with the sensor S2. Therefore, the LC circuit of the resonance producing unit 4A, the plasma generating electrode 10, and the plasma P form an RLC resonance circuit (specifically, a series RLC resonance circuit). With this configuration, voltage amplified through a resonance phenomenon is applied to the plasma generating electrode 10 even when the impedance of the plasma P changes. Moreover, the capacitance of the capacitor C1 of the LC circuit is larger than the expected capacitance of the plasma. Therefore, even when the impedance of the plasma P changes, the change has a small influence on a voltage change of the plasma generating electrode 10. Furthermore, the magnitude of the radio-frequency power supplied from the power source unit 3A is controlled in such a manner as to bring the voltage of the plasma generating electrode 10 measured with the voltmeter 7 close to the set voltage as a target. With the above configuration, the voltage of the plasma generating electrode 10 is kept at a value close to the set voltage even when the impedance of the plasma P changes with a change in state of the plasma P, making changes in the absorbed energy of the plasma P small, and processing using the plasma can therefore be performed with high accuracy and stability.

The formation of the RLC resonance circuit by the LC circuit of the resonance producing unit 4A, the plasma generating electrode 10, and the plasma P allows the impedance matching to be performed between the power source unit 3A and the plasma P, without the need of the mechanically driven way as in conventional practice and the impedance matching can be performed at high speed. In addition, use of a direct digital synthesizer (DDS) as an oscillator of which frequency is variable dispenses with the mechanically driven way, and frequency of the oscillator can be controlled at high speed.

Furthermore, the power source unit 3A and the resonance producing unit 4A are integrated into the power source apparatus 40A. Therefore, when this power source apparatus 40A is connected directly to the plasma generating electrode 10 without commercial coaxial cable or the like, a characteristic impedance need not be limited to a characteristic impedance determined by standard (e.g., 50Ω) but can be freely set, and high voltage can be generated with low output.

Each of the plasma control apparatus 100 according to the first embodiment, the plasma control apparatus 200 according to the second embodiment, and the plasma control apparatus 200A according to the third embodiment that are described above can be applied to a plasma processing apparatus alone. In a case of a plasma processing apparatus in which inductively coupled plasma is generated, the plasma control apparatus 100 according to the first embodiment and the plasma control apparatus 200 according to the second embodiment are applicable in combination. In a case of a plasma processing apparatus in which capacitively coupled plasma is generated, the plasma control apparatus 100 according to the first embodiment and the plasma control apparatus 200A according to the third embodiment are applicable in combination.

Description will be made below about results of evaluating the performance of the plasma control apparatus 100 according to the first embodiment of the present invention and the performance of the conventional plasma control apparatus 100'.

Figure 1:
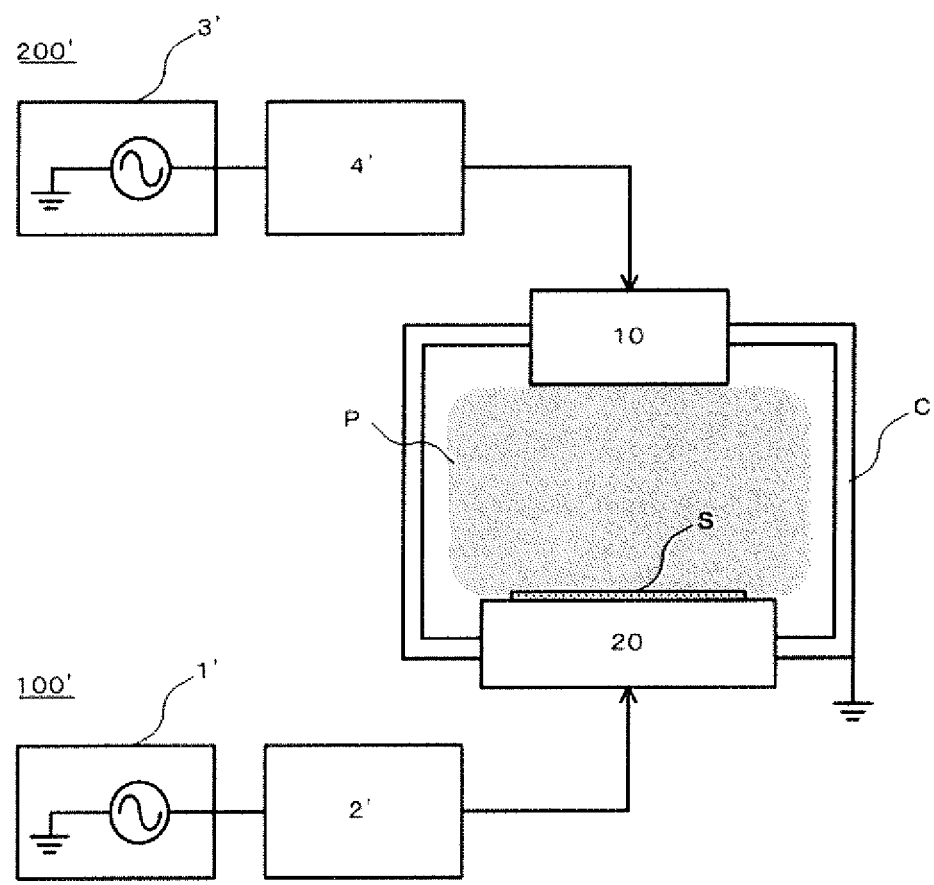
FIG. 1 is a schematic configuration diagram of conventional plasma control apparatus.
Figure 2:
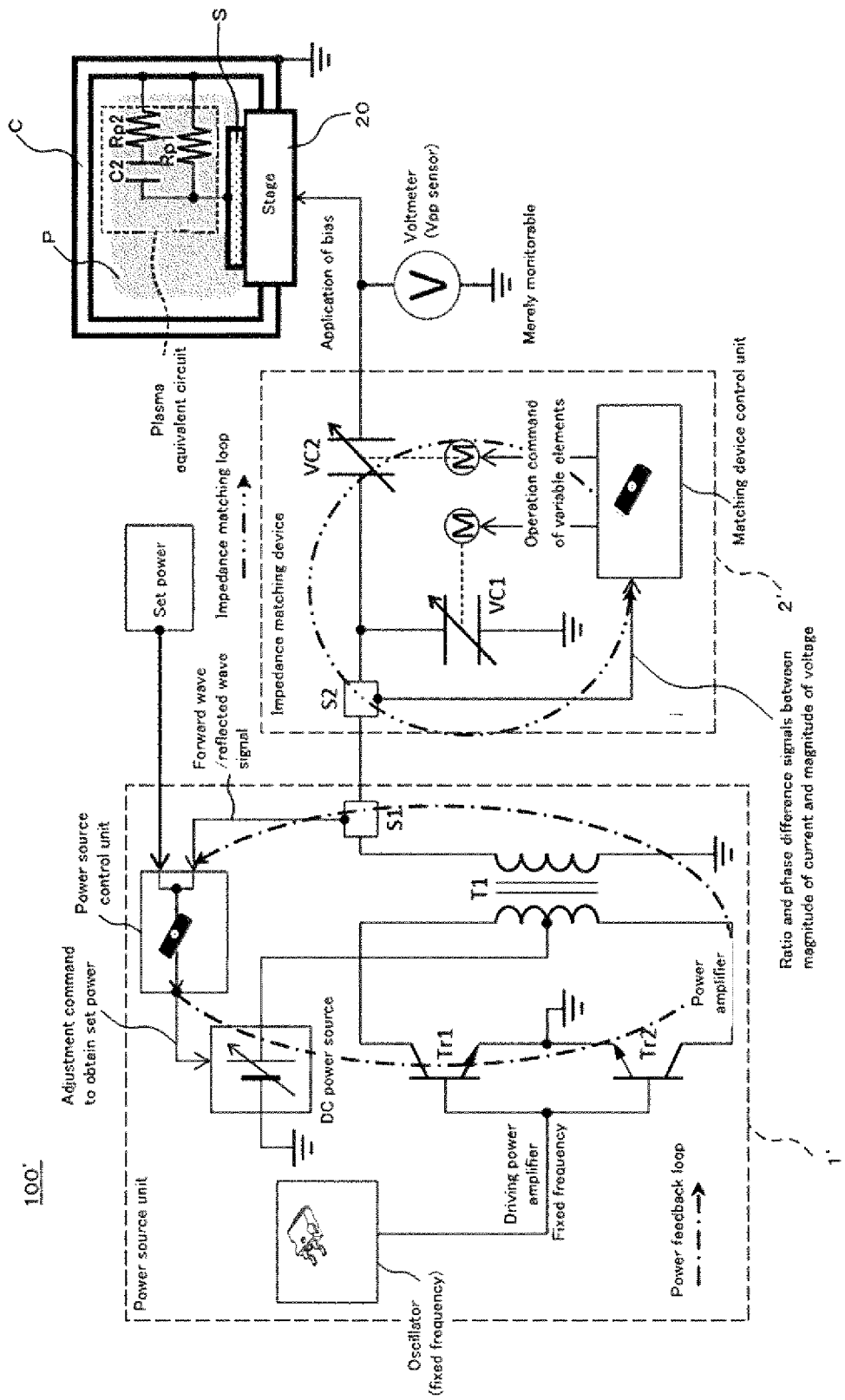
FIG. 2 is a diagram illustrating a specific configuration example of a conventional plasma control apparatus that is connected to a stage.
Figure 3:
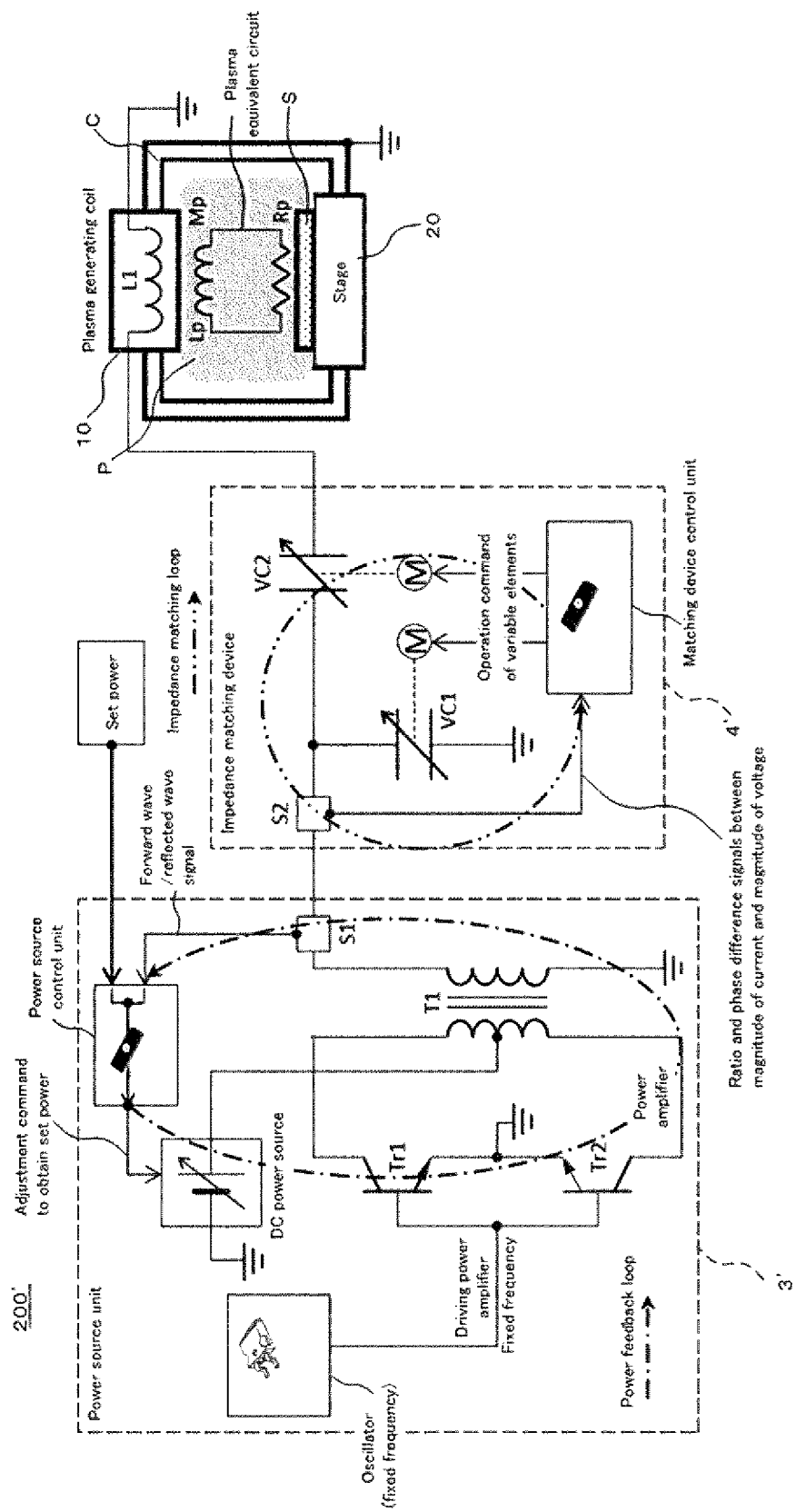
FIG. 3 is a diagram illustrating a specific configuration example of a conventional plasma control apparatus that is connected to a plasma generating coil.
Figure 4:
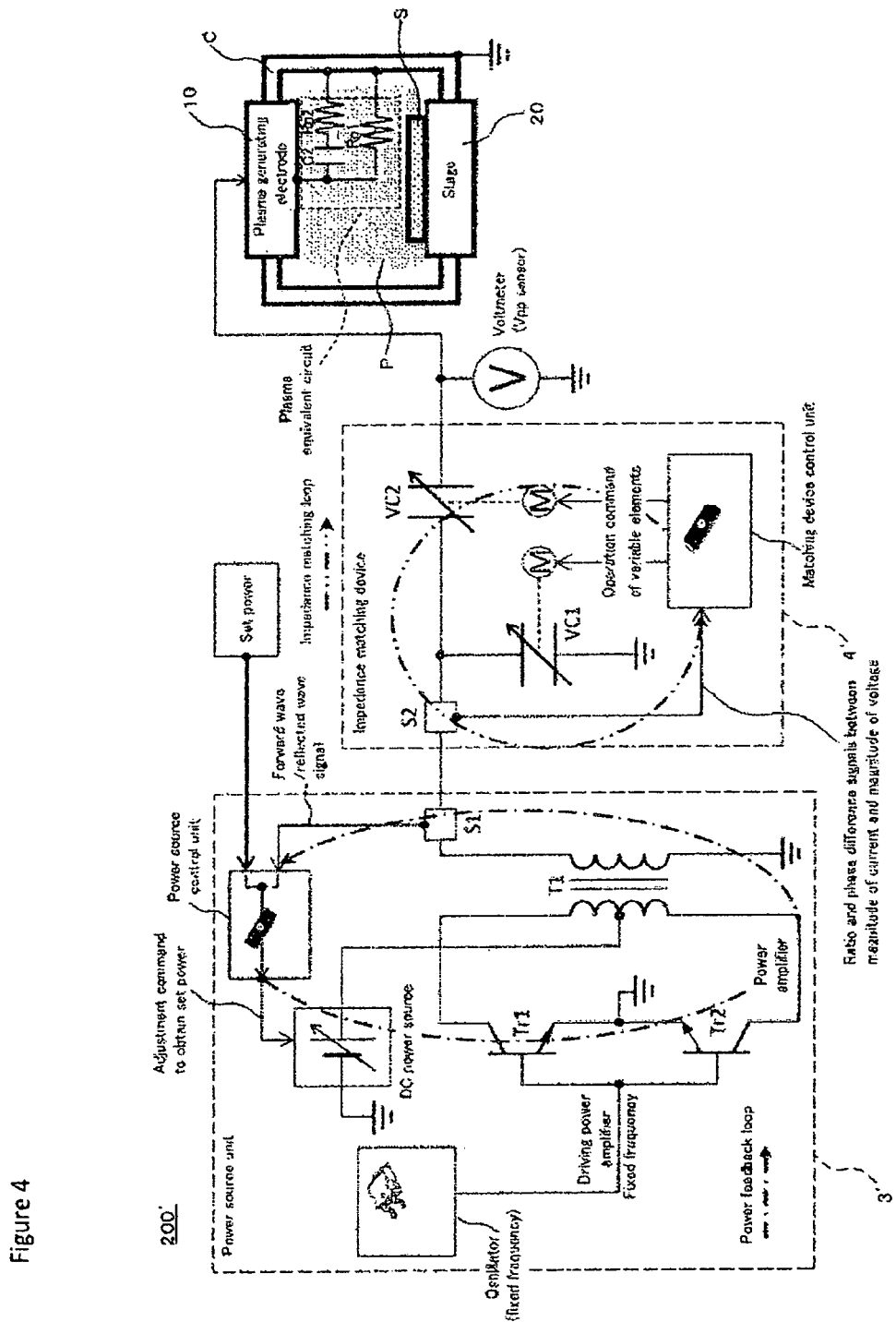
FIG. 4 is a diagram illustrating a specific configuration example of a conventional plasma control apparatus that is connected to a plasma generating electrode.

Specifically, a test 1 in which etching was performed on a substrate S was conducted for a plasma processing apparatus in which inductively coupled plasma is generated, where the plasma control apparatus 100 according to the first embodiment (see FIG. 6) was connected to a stage 20 on which the substrate S was placed, and the conventional plasma control apparatus 200' (see FIG. 3) was connected to a plasma generating coil 10. Meanwhile, a test 2 in which etching was performed on a substrate S was conducted for the same plasma processing apparatus, where the conventional plasma control apparatus 100' (see FIG. 2) was connected to the stage 20, and the conventional plasma control apparatus 200' (see FIG. 3) was connected to the plasma generating coil 10.

The results of the above tests 1 and 2 are shown in Table 1.

TABLE 1

| Plasma control apparatus | | Vpp | Frequency | Output | E/R | Uniformity |
|---|---|---|---|---|---|---|
| Test 2 | Conventional practice (FIG. 2 + FIG. 3) | 130 V | 2 MHz | 8 W | 53 mm/min | 9.1% |
| Test 1 | The present invention (FIG. 6 + FIG. 3) | 130 V | 2 MHz | 0.3 W | 50 mm/min | 5.6% |

In Table 1, values shown in the column of "Vpp" mean the voltages (Vpp signals) of the stage 20 measured with the voltmeter. Values shown in the column of "Frequency" mean the frequencies of the radio-frequency powers supplied from the power source units 1 and 1'. Values shown in the column of "Output" mean power values applied to the stage 20. Values shown in the column of "E/R" mean etching rates for the substrates S. Values shown in the column of "Uniformity" mean uniformities of etching rates on surfaces of the substrates S.

As shown in Table 1, it was found that, in the same condition of the voltage of the stage 20, the present invention was able to provide an etching performance equivalent to that in conventional practice even with a low output (low power value).

In addition, in the above tests 1 and 2, the pressure in the chamber C was changed in the middle of the etching, and the stability of the voltage of the stage 20 at that time was evaluated. Specifically, in the conditions to be described as the following (1) to (3), the pressure in the chamber C was changed from 30 Pa to 5 Pa, and fluctuations of the voltage (Vpp signal) measured with the voltmeter at that time were evaluated.

Figure 12A:
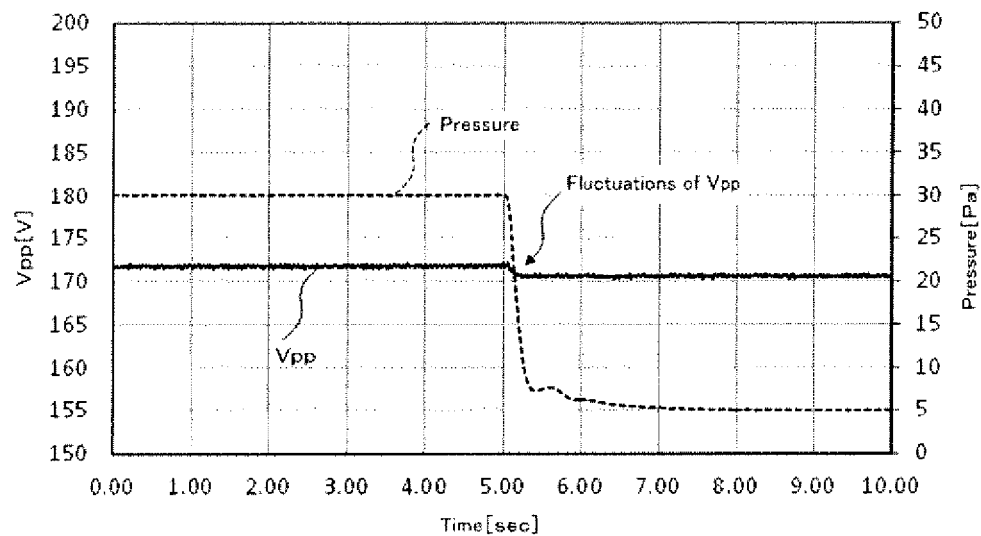
FIG. 12A and FIG. 12B are graphs illustrating an example of results of evaluation in the conventional practice and in the present invention respectively.
Figure 12B:
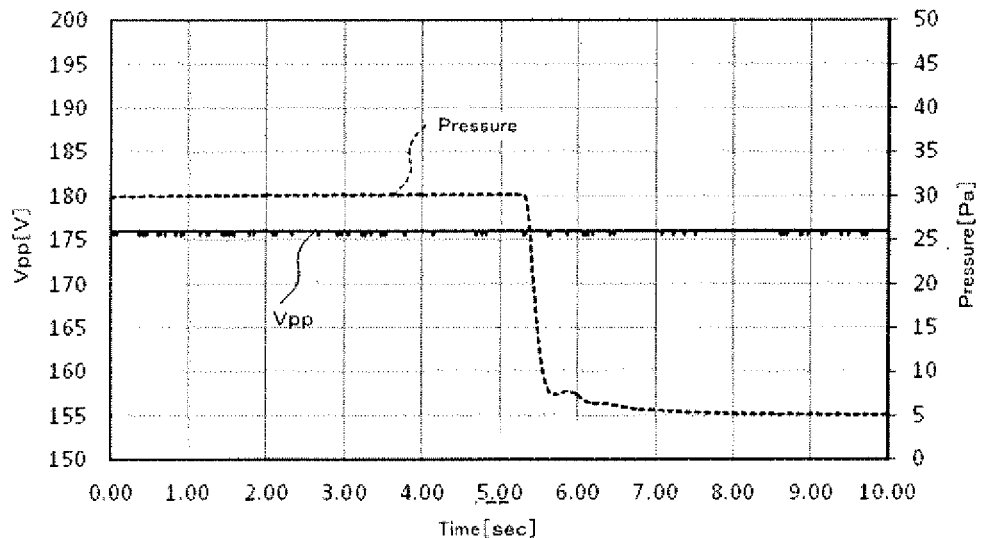

(1) Set power to the plasma generating coil 10: 40 W
(2) Gas supplied into the chamber C: $C_4F_8$ (flow rate 8 sccm)
(3) Set Vpp in the test 1: 170 V FIG. 12A and FIG. 12B are graphs illustrating an example of results of the evaluation in the above tests. FIG. 12A illustrates the results of evaluation in the test 2 (conventional practice), and FIG. 12B illustrates the results of evaluation in the test 1 (the present invention).

As illustrated in FIG. 12A, in the case of the test 2 where the conventional plasma control apparatus 100' (see FIG. 2) was connected to the stage 20, a change occurred in the voltage of the stage 20 with a change in the pressure in the chamber C. In contrast, as illustrated in FIG. 12B, in the case of the test 1 where the plasma control apparatus 100 (see FIG. 6) according to the first embodiment was connected to the stage 20, it was found that the voltage of the stage 20 was stabilized even when a change occurred in the pressure in the chamber C.

EXPLANATION OF REFERENCES

1, 3, 3A Power source unit
2, 4, 4A Resonance producing unit
5, 7 Voltmeter
6 Ammeter
10 Element (plasma generating coil or plasma generating electrode)
20 Stage
S Substrate
C Chamber
P Plasma

The invention claimed is:

1. A plasma control apparatus for supplying radio-frequency power to a plasma processing apparatus,
the plasma processing apparatus comprising a coil for generating inductively coupled plasma or an electrode for generating capacitively coupled plasma, and a stage on which a substrate is placed, the placed substrate being subjected to processing using any one of the inductively coupled plasma and the capacitively coupled plasma, wherein
the plasma control apparatus comprises:
a power source unit configured to supply radio-frequency power to the stage;
a resonance producing unit interposed between the power source unit and the stage, and configured to apply the radio-frequency power supplied from the power source unit to the stage; and
a voltmeter configured to measure a voltage of the stage,
the resonance producing unit comprises:
an LC circuit formed by a coil and a first capacitor and a second capacitor where a first end of the first capacitor is connected to the coil and a second end of the first capacitor is connected in parallel to the substrate stage and a first end of the second capacitor; wherein a second end of the second capacitor is connected to ground;
and a sensor configured to detect a phase difference between current flowing in and voltage applied to the LC circuit,
a capacitance of the second capacitor of the LC circuit is larger than an expected capacitance of the plasma,
the expected capacitance of the plasma is 100 pF to 110 pF when the radio-frequency power supplied from the power source unit has a frequency of 2 MHz, and 400 pF to 1200 pF when the radio-frequency power supplied from the power source unit has a frequency of 380 kHz,
the power source unit is configured to control a magnitude of the radio-frequency power to be supplied in such a manner as to bring the voltage measured with the voltmeter close to a set voltage as a target, and is configured to control a frequency of the radio-frequency power to be supplied in such a manner as to minimize the phase difference detected with the sensor, and the plasma control apparatus does not comprise an impedance matching device that performs impedance matching between the power source unit and the plasma in a mechanically driven way.

2. A plasma control apparatus for supplying radio-frequency power to a plasma processing apparatus,
the plasma processing apparatus comprising a plasma generating electrode for generating capacitively coupled plasma, and a stage on which a substrate is placed, the placed substrate being subjected to processing using the capacitively coupled plasma, wherein
the plasma control apparatus comprises:
a power source unit configured to supply radio-frequency power to the plasma generating electrode;
a resonance producing unit interposed between the power source unit and the plasma generating electrode, and configured to apply the radio-frequency power supplied from the power source unit to the plasma generating electrode; and a voltmeter configured to measure a voltage of the plasma generating electrode, the resonance producing unit comprises:

an LC circuit formed by a coil and a first capacitor and a second capacitor where a first end of the first capacitor is connected to the coil and a second end of the first capacitor is connected in parallel to the plasma generating electrode and a first end of the second capacitor; wherein a second end of the second capacitor is connected to ground;

and a sensor configured to detect a phase difference between current flowing in and voltage applied to the LC circuit, a capacitance of the second capacitor of the LC circuit is larger than an expected capacitance of the plasma, the expected capacitance of the plasma is 100 pF to 110 pF when the radio-frequency power supplied from the power source unit has a frequency of 2 MHz, and 400 pF to 1200 pF when the radio-frequency power supplied from the power source unit has a frequency of 380 kHz, the power source unit is configured to control a magnitude of the radio-frequency power to be supplied in such a manner as to bring the voltage measured with the voltmeter close to a set voltage as a target, and is configured to control a frequency of the radio-frequency power to be supplied in such a manner as to minimize the phase difference detected with the sensor, and the plasma processing apparatus does not comprise an impedance matching device that performs impedance matching between the power source unit and the plasma in a mechanically driven way.

* * * * *